(12) United States Patent
Chang et al.

(10) Patent No.: US 8,907,428 B2
(45) Date of Patent: Dec. 9, 2014

(54) CELL CIRCUITS AND LAYOUTS USED IN WRITE TRACKING CIRCUITS AND READ TRACKING CIRCUITS

(71) Applicant: Taiwan Semiconductor Manufacturing Company, Ltd., Hsinchu (TW)

(72) Inventors: Jacklyn Chang, San Ramon, CA (US); Derek C. Tao, Fremont, CA (US); Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/687,366

(22) Filed: Nov. 28, 2012

(65) Prior Publication Data

US 2014/0138776 A1    May 22, 2014

Related U.S. Application Data

(60) Provisional application No. 61/728,393, filed on Nov. 20, 2012.

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *G11C 11/419* | (2006.01) |
| *H01L 27/11* | (2006.01) |

(52) U.S. Cl.
CPC .......... *G11C 11/419* (2013.01); *H01L 27/1104* (2013.01); *H01L 27/1116* (2013.01)
USPC ............... 257/369; 257/E21.632; 438/199

(58) Field of Classification Search
USPC ............ 257/369, E21.632, E29.345; 438/199
See application file for complete search history.

(56) References Cited

U.S. PATENT DOCUMENTS

| | | | |
|---|---|---|---|
| 2008/0061373 A1* | 3/2008 | Park .............................. | 257/369 |
| 2009/0014806 A1* | 1/2009 | Ostermayr et al. ........... | 257/369 |
| 2011/0241121 A1* | 10/2011 | Kwon et al. .................. | 257/369 |

* cited by examiner

*Primary Examiner* — Phuc Dang
(74) *Attorney, Agent, or Firm* — Lowe Hauptman & Ham, LLP

(57) ABSTRACT

A circuit includes a first transistor and a second transistor of a first type, a first transistor, a second transistor, a third transistor, and a fourth transistor of a second type. The first and second transistors of the first type, and the first transistor and the second transistor of the second type form a cross latch having a first node and a second node. A first terminal of the third transistor of the second type is coupled with the first node. A first terminal of the fourth transistor of the second type is coupled with the second node. At least one of a second terminal of the third transistor of the second type or a second terminal of the fourth transistor of the second type is configured to receive a signal sufficient to turn off the third transistor or the fourth transistor that is not directly from a power source.

18 Claims, 11 Drawing Sheets

US 8,907,428 B2

CELL CIRCUITS AND LAYOUTS USED IN WRITE TRACKING CIRCUITS AND READ TRACKING CIRCUITS

RELATED APPLICATIONS

The present application claims priority of U.S. Provisional Patent Application Ser. No. 61/728,393, filed on Nov. 20, 2012, which is incorporated herein by reference in its entirety.

The present disclosure is related to co-pending application entitled "Tracking Mechanism for Writing to a Memory Cell," having an application Ser. No. 13/560,461, filed on Jul. 27, 2012, which is incorporated by reference in its entirety.

The present disclosure is also related to co-pending application entitled "Multiple Bitcells Tracking Scheme for Advanced Semiconductor Memories," having an application Ser. No. 13/627,108, filed on Sep. 26, 2012, which is incorporated by reference by its entirety.

FIELD

The present disclosure is related to cell circuits for use in write tracking circuits and read tracking circuits.

BACKGROUND

Write tracking circuits for memory cells provide tracking signals based on which write signals are generated for use in writing data to a memory cell. As technologies evolve, existing write tracking circuits for use with older technologies are no longer suitable.

Read tracking circuits for memory cells provide tracking signals based on which read signals are generated for use in reading data from a memory cell. Similarly to the write tracking circuits, as technologies evolve, existing read tracking circuits for use with older technologies are no longer suitable.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1A:
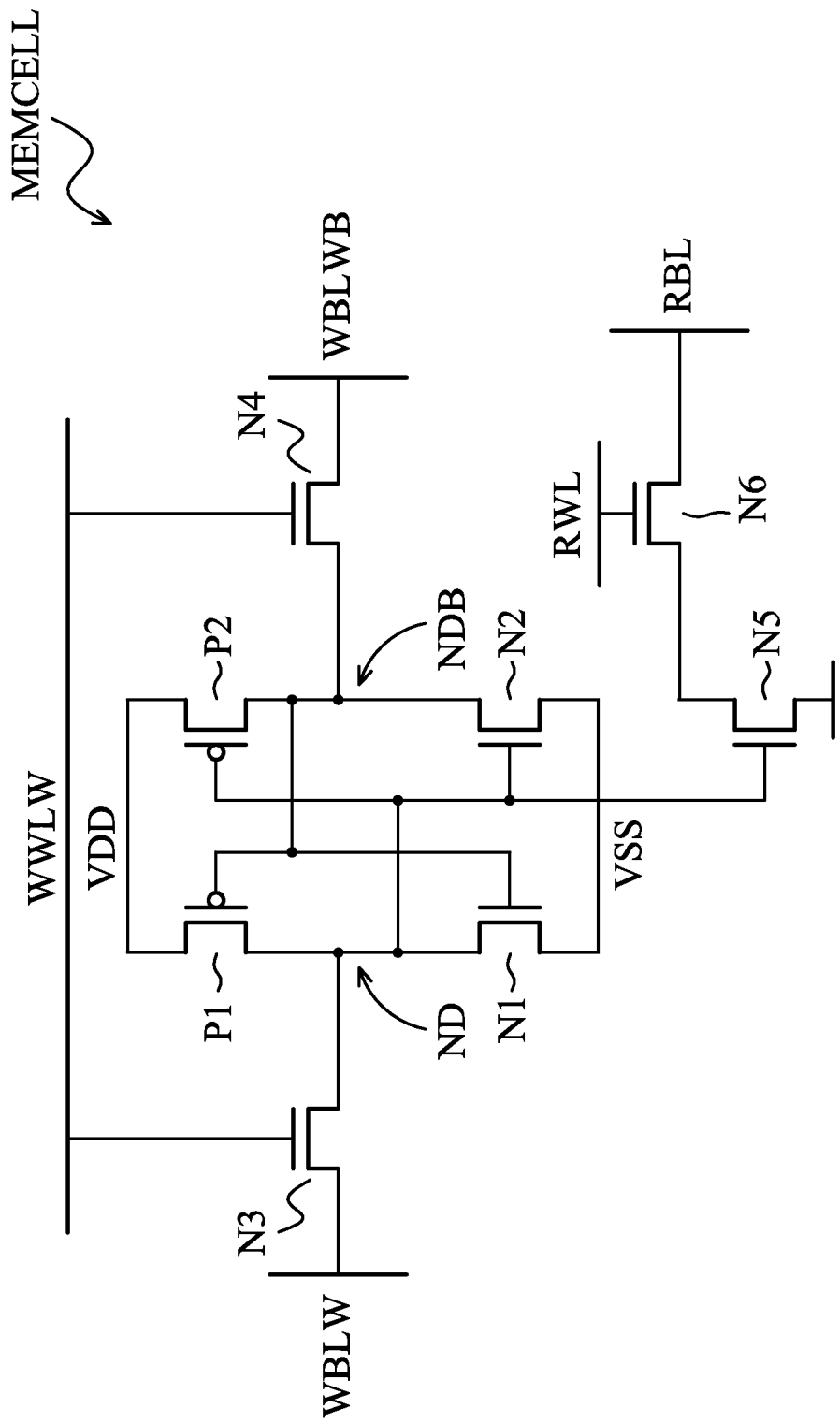
FIG. 1A is a circuit diagram of a memory cell, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. Gates of some transistors in a tracking cell circuit are configured to receive a particular signal to meet a design rule in which a gate of a transistor is not supposed to directly receive a supply voltage source or a reference supply voltage source. Circuit layouts for the gates of the transistor to receive the particular signal are also disclosed. A source of the transistor is configured as a node corresponding to a storage node of a memory cell. The source of and a drain of the transistor are coupled together. As a result, a voltage value of the node is programmed to a value applied to the drain of the transistor. Circuit layouts for the drain and the source of the transistor coupled together are also disclosed.

An example of a write tracking circuit is disclosed in a co-pending application, entitled "Tracking Mechanism for Writing to a Memory Cell," filed on Jul. 27, 2012 with an application Ser. No. 13/560,461, and, for illustration, is called "Writing Tracking Application."

An example of a read tracking circuit is disclosed in another co-pending application, entitled "Multiple Bitcells Tracking Scheme Semiconductor Memory Array", filed on Sep. 26, 2012 with application Ser. No. 13/627,108, and is called "Read Tracking Application."

Memory Cell

FIG. 1A is a circuit diagram of memory cell MEMCELL. FIG. 1A is a reproduction of FIG. 3 of the Write Tracking Application. For simplicity, currents IPU, IPG, and IPD are not labeled, however. MEMCELL includes a PMOS transistor P1, a PMOS transistor P2, an NMOS transistor N1, and an NMOS transistor N2 configured as a cross latch. An NMOS transistor N5, an NMOS transistor N6, a read word line RWL, and a read bit line RBL form a read port for memory cell MEMCELL.

Tracking Cell

Figure 1B:
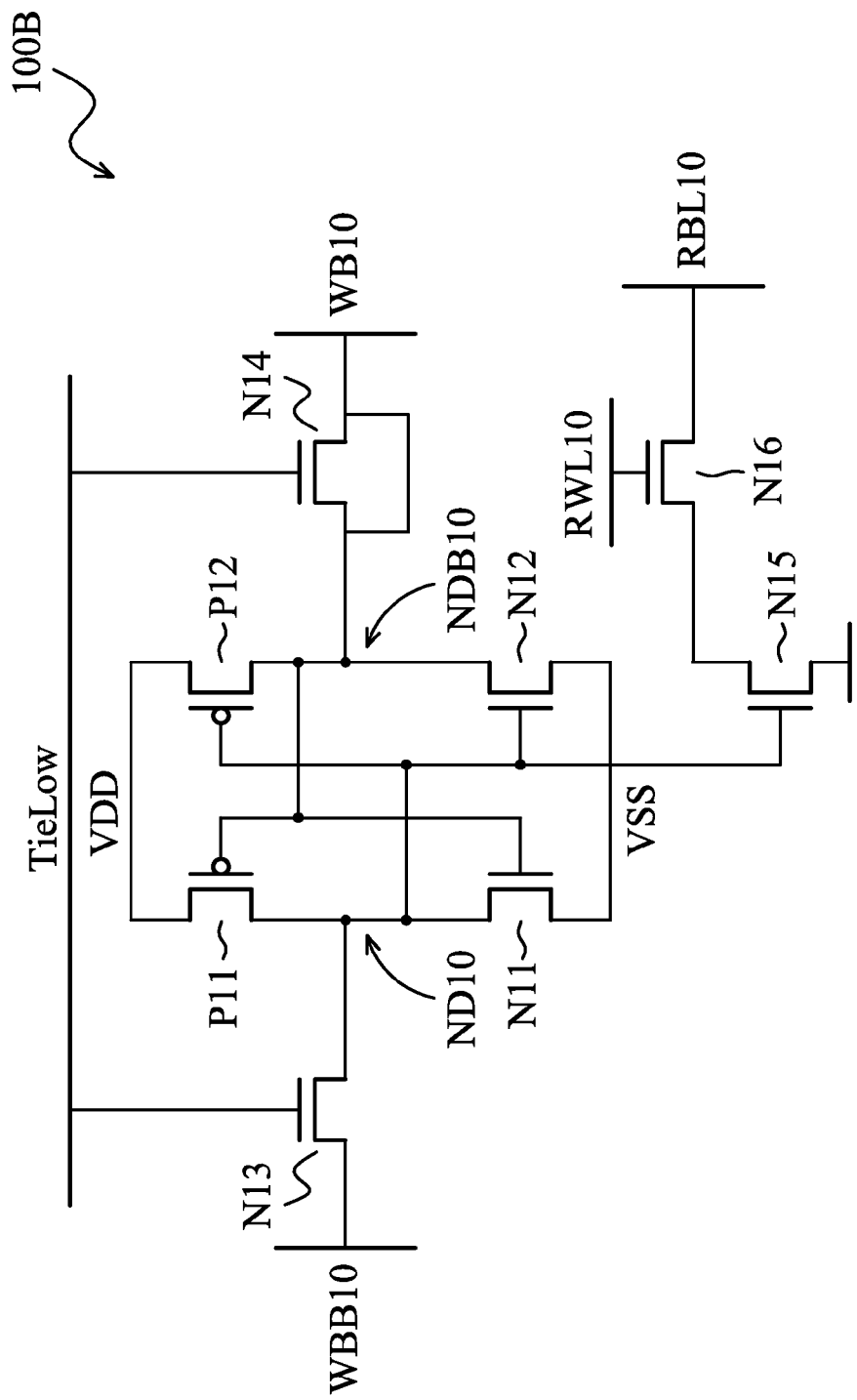
FIG. 1B is a diagram of a tracking cell, in accordance with some embodiments.

FIG. 1B is a diagram of a circuit 100B, in accordance with some embodiments. Circuit 100B is a tracking cell for use in a read tracking circuit, such as one in the Read Tracking Application. For example, circuit 100B is implemented as a tracking cell such as $124_{R1A}$, $124_{R1B}$, $124_{R2A}$, $124_{R2B}$, $124_{L1A}$, $124_{L1B}$, $124_{L2A}$, or $124_{L2B}$ in FIG. 6 of the Read Tracking Application.

Tracking cell 100B includes transistors similar to transistors of memory cell MEMCELL in FIG. 1A, except that transistors in tracking cell 100B are configured differently from transistors in memory cell MEMCELL in FIG. 1A.

Transistors P11, P12, N11, N12, N13, N14, N15, and N16 correspond to transistors P1, P2, N1, N2, N3, N4, N5, and N6 in memory cell MEMCELL, respectively. Node ND10 and node NDB10 correspond to node ND and node NDB, respectively. Effectively, PMOS transistor P11, PMOS transistor P12, NMOS transistor N11, and NMOS transistor N12 form a cross latch having nodes ND10 and NDB10. Lines WBB10, WB10, RWL10, and RBL10, correspond to lines WBLW, WBLWB, RWL, and RBL, respectively.

Gates of NMOS transistors N13 and N14 are coupled together, and are configured to receive a TieLow signal, which is explained in detail with reference to FIG. 2.

A source of NMOS transistor N14 is configured as node NDB10. A drain of NMOS transistor N14 is coupled with line WB10. The drain and the source of NMOS transistor N14 are coupled together. As a result, node NDB10 and line WB10 are electrically coupled together. In some embodiments, line node NDB10 and WB10 are electrically coupled together by a via. Further, a logical value of node NDB10 is programmed by applying a logical value to line WB10.

Figure 2:
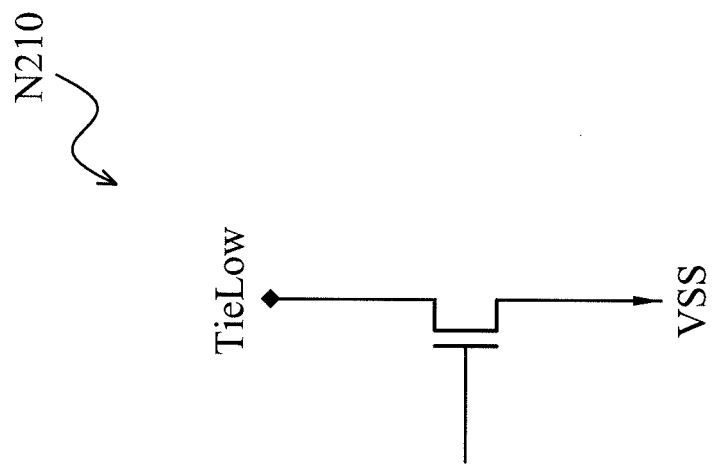
FIG. 2 is a diagram a circuit generating a signal TieLow, in accordance with some embodiments.

FIG. 2 is a diagram a circuit N210 generating the signal TieLow, in accordance with some embodiments. In some embodiments, circuit N210 is referred to as NMOS transistor N210. NMOS transistor N210 is used to provide signal TieLow in FIG. 1B with a low logical value. For example, when transistor N210 is turned on, signal TieLow at a drain of transistor N210 is pulled to reference supply voltage VSS, which is a low logical value, at a source of transistor N210. In some embodiments, supply reference voltage VSS is ground. Because the gates of NMOS transistors N13 and N14 in FIG. 1B are configured to receive signal TieLow, the gates of NMOS transistor N13 and N14 indirectly receive a low logical value of voltage VSS at the source of NMOS transistor N210. Effectively, signal TieLow has a low logical value sufficient to turn off NMOS transistor N13 or transistor N14. For example, signal TieLow is less than a threshold voltage to turn on transistor N13 or transistor N14. Further, signal TieLow is not directly from a power source, such as a power source that provides voltage VSS. In contrast, signal TieLow from the drain of NMOS transistor N210 is indirectly from the power source that provides voltage VSS. In various embodiments, signal TieLow received through the drain of NMOS transistor N210, instead directly from the VSS power source, reduces an electrostatic effect asserted on devices received signal TieLow, such as transistors N13 and N14.

In some embodiments, signal TieLow is provided through a metal piece of a metal one layer that is electrically coupled with gates of transistors N13 and N14. Effectively, signal TieLow is provided to the gates of transistors N13 and N14. For example, the drain of NMOS transistor N210 having signal TieLow is electrically coupled with the metal piece of the metal one layer.

One NMOS transistor N210 in FIG. 2 used to provide signal TieLow is for illustration. More than one transistor coupled in series and/or parallel is within the scope of various embodiments. For example, NMOS transistor N210 is coupled in series with another transistor, such as an NMOS transistor N210S (not shown). In such a situation, a drain of NMOS transistor N210S receives signal TieLow, a source of NMOS transistor N210S is coupled with the drain of NMOS transistor N210. For another example, NMOS transistor N210 is coupled in parallel with another transistor, such as an NMOS transistor N210P (not shown). In such a situation, drains of NMOS transistors N210 and N210P are coupled together and receive signal TieLow. Further, sources of NMOS transistors N210 and P210 are coupled together and receive reference supply voltage VSS.

Figure 3A:
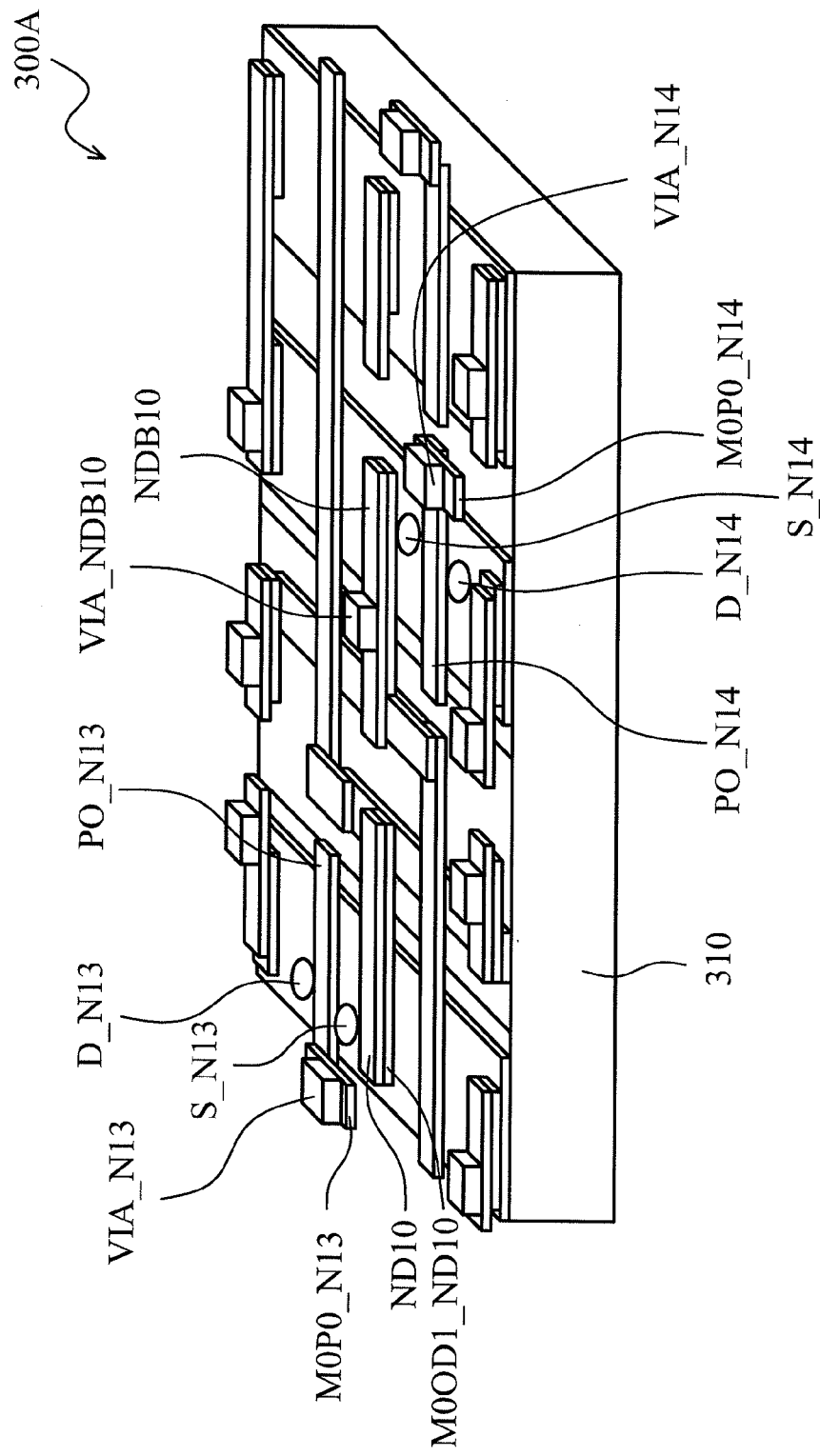
FIGS. 3A and 3B are diagrams of layout arrangements of circuit elements of the circuit in FIG. 1, in accordance with some embodiments.
Figure 3B:
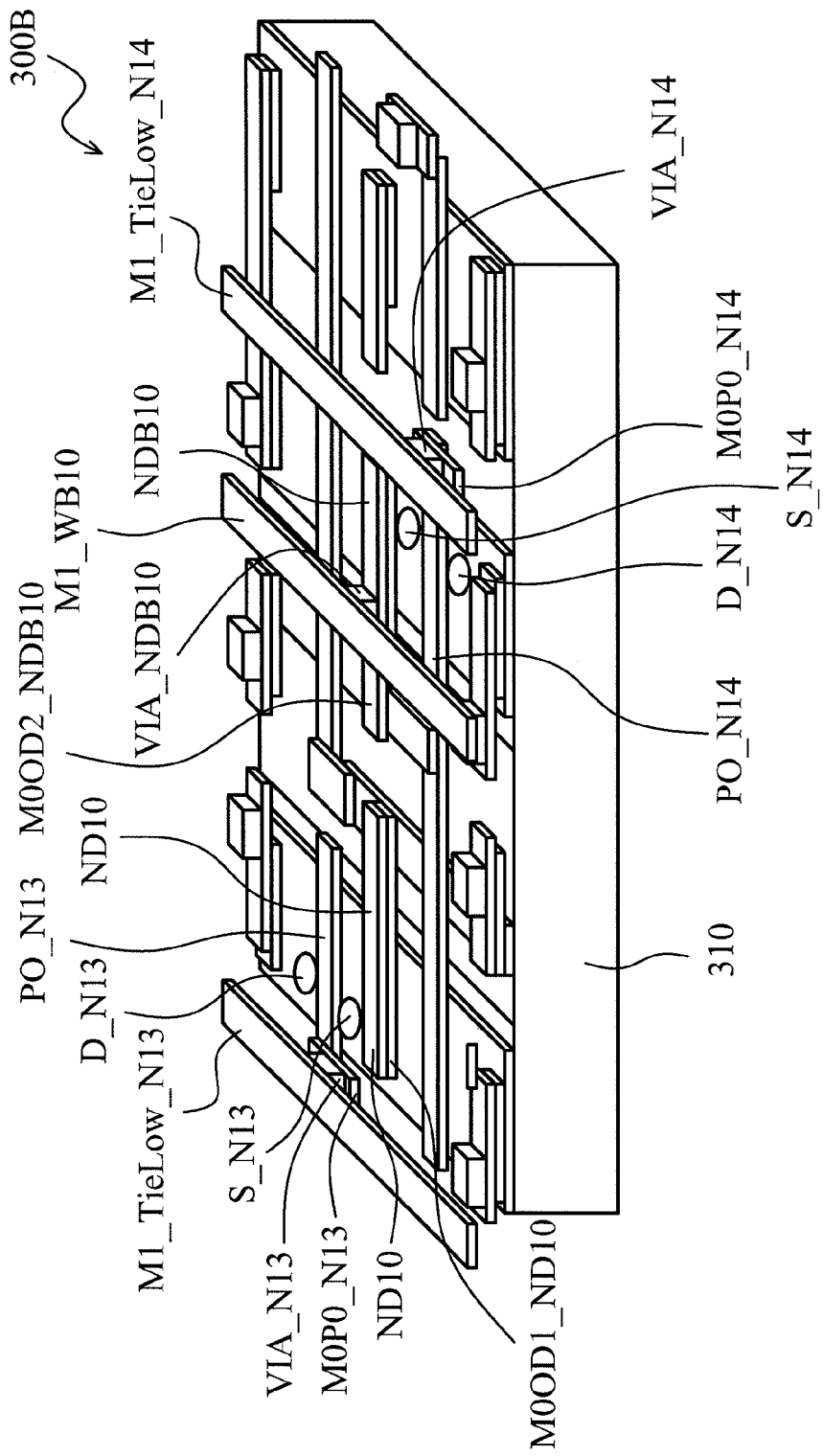

FIGS. 3A and 3B are diagrams of layout arrangements 300A and 300B of circuit elements of circuit 100B, in accordance with some embodiments. Layout 300B includes layout 300A with an addition of metal pieces M1_TieLow_N13, M1_TieLow_N14, and M1_WB10. For simplicity, some circuit elements are labeled while some other circuit elements are not labeled.

Layout 300A includes a substrate 310, oxide diffusion (OD) areas, a plurality of features and a plurality of connections between features. In some embodiments, the plurality of features and connections are arranged in a plurality of different types of layers, such as a poly layer, a poly-to-OD layer, conductive or metal layers, etc. OD areas are part of substrate 310, and are used to form a drain or a source of a transistor, for example. OD areas forming a drain each have a name starting with "D," and OD areas forming a source each have a name starting with "S." The OD areas are formed using the same steps in a manufacturing process, which, for illustration, is called the same manufacturing process or the same process. A piece of poly in a poly layer is used to form gates of transistors, to connect gates of different transistors together, etc. Pieces of poly each have a name starting with "PO," and are formed by a same process. A piece of poly-to-OD in a poly-to-OD layer is used to connect a poly piece to an OD area. Pieces of poly-to-OD each have a name starting with "M0P0," and are formed by a same process. A piece of contact in a first contact layer is used to couple an OD area and a piece of interconnect in an interconnect layer. Pieces of contact in the first contact layer each have a name starting with "M0OD1" and are formed by a same process. A piece of interconnect in the interconnect layer is used to couple a piece of contact in the first contact layer to a via. Pieces of interconnects in the interconnect layer each have a name starting with "M0OD2," and are formed by a same process. Vias each have a name starting with "VIA." The metal layers include metal pieces in metal one layer, metal two layer, metal three layer, etc. Metal one layer is a first metal layer above interconnect layer M0OD2. Metal two layer is above metal one layer, and metal three layer is above metal two layer, etc. Metal pieces in the metal one layer each have a name starting with "M1," and are formed by a same process.

In FIG. 3A, a piece of polysilicon or poly P0_N14 is used to form a gate of transistor N14 in FIG. 1B. An OD area D_N14 is used to form a drain of transistor N14. An OD area S_N14 is used to form a source of transistor N14. OD areas D_N14 and S_N14 are part of substrate 310.

A piece of contact M0P0_N14 is coupled with poly piece PO_N14 formed as the gate of transistor N14. In some embodiments, piece M0P0_N14 includes materials used as contacts, vias, or the like. A via VIA_N14 is coupled with piece M0P0_N14. As shown in FIG. 3B, via VIA_N14 is coupled with a piece of metal M1_TieLow_N14, which is configured to receive signal TieLow. Effectively, poly piece PO_N14 is electrically coupled with metal piece M1_TieLow_N14. Explained in a different way, the gate of NMOS transistor N14 in FIG. 3A is configured to receive signal TieLow.

A piece M0OD1_NDB10 is electrically coupled with OD area S_N14. In some embodiments, piece M0OD1_NDB10 includes materials used as contacts. A piece of M0OD2_NDB10 functions as node NDB10 in FIG. 1B. Piece M0OD2_NDB10 is coupled with piece M0OD1_NDB10. A via VIA_NDB10 is coupled with piece M0OD1_NDB10. As shown in FIG. 3B, a piece of metal M1_WB10 is coupled with via VIA_NDB10. Metal piece M1_WB10 is coupled with line WB10. Effectively, node NDB10 and line WB10 are electrically coupled together.

A piece of poly PO_N13 is used to form a gate of transistor N13 in FIG. 1B. An OD area D_N13 is used to form a drain of transistor N13. An OD area S_N13 is used to form a source of transistor N13. OD areas D_N13 and S_N13 are part of substrate 310.

A piece of contact M0P0_N13 is coupled with poly piece PO_N13 formed as the gate of transistor N13. In some embodiments, piece M0P0_N13 includes materials used as contacts, vias, or the like. A via VIA_N13 is coupled with piece M0P0_N13. As shown in FIG. 3B, via VIA_N13 is coupled with a piece of metal M1_TieLow_N13, which is configured to receive signal TieLow. Effectively, poly piece PO_N13 is electrically coupled with metal piece M1_TieLow_N13. Explained in a different way, the gate of NMOS transistor N13 is configured to receive signal TieLow. Because the gate of NMOS transistor N14 and the gate of NMOS transistor N13 are configured to receive signal TieLow, effectively, the gate of NMOS transistor N14 and the gate of NMOS transistor N13 are electrically coupled together.

In some embodiments, metal pieces M1_TieLow_N13, M1_TieLow_N14, M1_WB10 are on a same layer of metal one.

In some embodiments, metal pieces M1_TieLow_N13 and M1_TieLow_N14 are electrically coupled together, but are not shown in FIG. 3B. For example, another metal piece on the metal one layer (not shown) couples metal pieces M1_TieLow_N13 and M 1_TieLow_N14.

Dummy Tracking Cell, Some Embodiments

Figure 4:
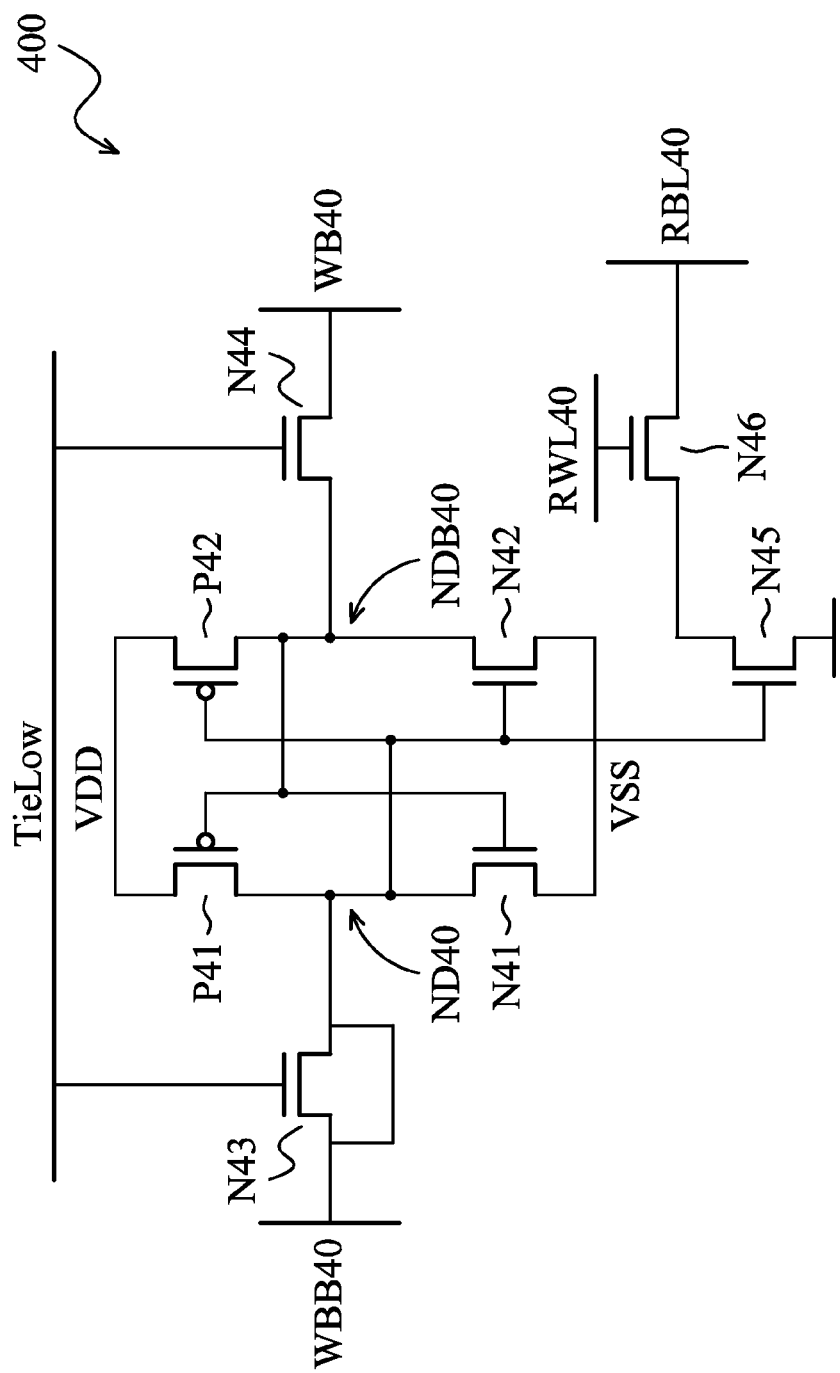
FIG. 4 is a diagram of a circuit of a tracking cell, in accordance with some embodiments.

FIG. 4 is a diagram of a circuit 400, in accordance with some embodiments. In some embodiments, circuit 400 is a "dummy" tracking cell used to affect a load of a read tracking circuit. For example, one or a plurality of circuits 400 is coupled to a tracking bit line $TBL_L$ or tracking bit line $TBL_R$ in FIG. 6 in the Read Tracking Application.

Dummy tracking cell 400 includes transistors similar to transistors in tracking cell 100B in FIG. 1B, except that transistors in dummy tracking cell 400 are configured differently from transistors in tracking cell 100B. For example, compared with tracking cell 100B, transistors P41, P42, N41, N42, N43, N44, N45, and N46 correspond to transistors P11, P12, N11, N12, N13, N14, N15, and N16, respectively. Lines WBB40, WB40, RWL40, and RBL40 correspond to lines WBB10, WB10, RWL10, and RBL10, respectively. Nodes ND40 and NDB40 correspond to nodes ND10 and NDB10, respectively. A drain and a source of NMOS transistor N43 are coupled together.

Figure 5A:
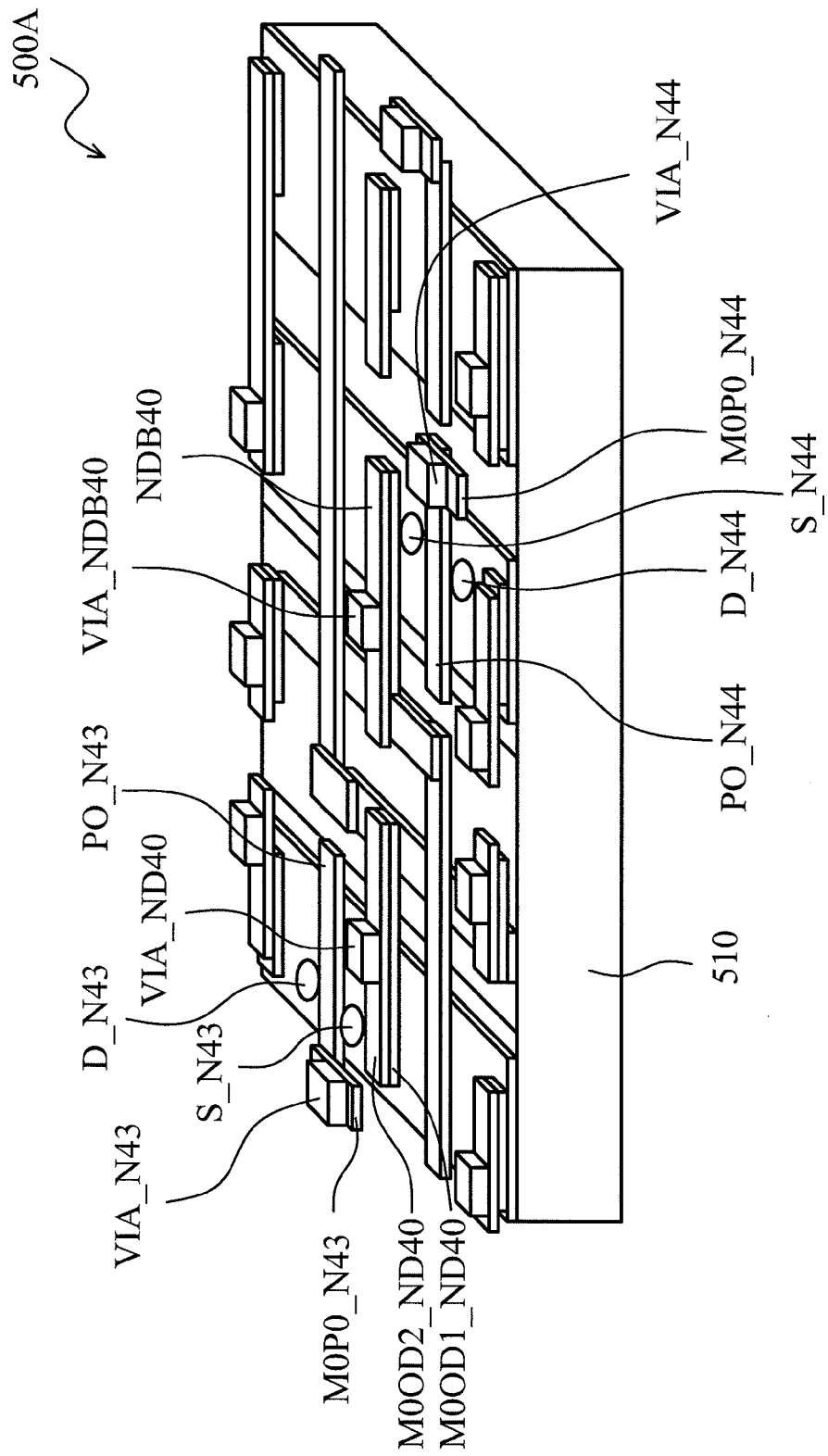
FIGS. 5A and 5B are diagrams of layout arrangements of circuit elements of the circuit in FIG. 4, in accordance with some embodiments.
Figure 5B:
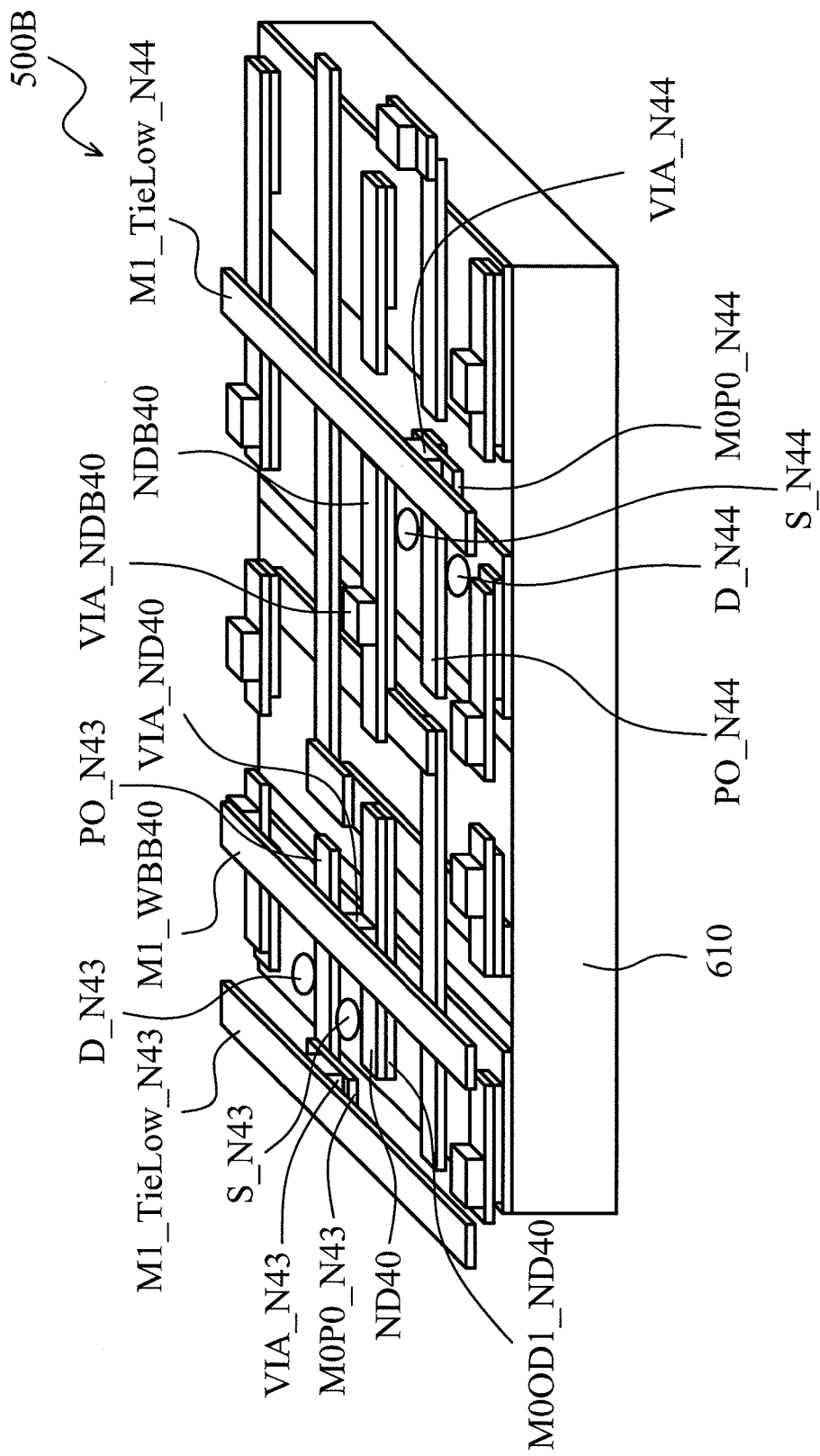

FIGS. 5A and 5B are diagrams of layout arrangements 500A and 500B of circuit 400, in accordance with some embodiments. Layout 500B includes layout 500A with an addition of metal pieces M1_TieLow_N43, M1_TieLow_N44, and M1_WBB40. For simplicity, some circuit elements are labeled while some other circuit elements are not labeled.

Similar to layout 300A, layout 500A includes a substrate 510, oxide diffusion (OD) areas, a plurality of layers of different types, such as a poly layer, a poly-to-OD layer, metal layers, etc., which were described above with reference to FIG. 3A.

In FIG. 5A, a piece of poly PO_N44 is used to form a gate of transistor N44 in FIG. 4. An OD area D_N44 is used to form a drain of transistor N44. An OD area S_N44 is used to form a source of transistor N44. OD areas D_N44 and S_N44 are part of substrate 510.

A piece of contact M0P0_N44 is coupled with poly piece PO_N44 that is formed as the gate of transistor N44. In some embodiments, piece M0P0_N44 includes materials used as contacts, vias, or the like. A via VIA_N44 is coupled with piece M0P0_N44. As shown in FIG. 5B, via VIA_N44 is coupled with a piece of metal M1_TieLow_N44.

A piece of poly PO_N43 is used to form a gate of transistor N43 in FIG. 4. An OD area D_N43 is used to form a drain of transistor N43. An OD area S_N43 is used to form a source of transistor N43. OD areas D_N43 and S_N43 are part of substrate 510.

A piece of contact M0P0_N43 is coupled with poly piece PO_N43. In some embodiments, piece M0P0_N43 includes materials used as contacts, vias, or the like. A via VIA_N43 is coupled with piece M0P0_N43. As shown in FIG. 5B, via VIA_N43 is coupled with a piece of metal M1_TieLow_N43. Metal piece M1_TieLow_N43 is configured to receive signal TieLow. Effectively, poly piece PO_N43 is electrically coupled with metal piece M1_TieLow_N43. Explained in a different way, the gate of NMOS transistor N43 is configured to receive signal TieLow.

Metal piece M1_TieLow_N43 is configured to receive signal TieLow. Effectively, poly piece PO_N43 is electrically coupled with metal piece M1_TieLow_N44. Because the gate of NMOS transistor N43 and the gate of NMOS transistor N44 are configured to receive signal TieLow, effectively, the gate of NMOS transistor N43 and the gate of NMOS transistor N44 are electrically coupled together.

A piece of contact M0OD1_ND40 is electrically coupled with diffusion area S_N43. In some embodiments, piece M0OD1_ND40 includes materials used as contacts. A piece of interconnect M0OD2_NDB40 functions as node ND40 in FIG. 4. Piece M0OD2_NDB40 is coupled with piece M0OD1_ND40. A via VIA_ND40 is coupled with piece M0OD1_ND40. As shown in FIG. 5B, a piece of metal M1_WBB40 is coupled with via VIA_ND40. Metal piece M1_WBB40 is coupled with line WBB40. Effectively, node ND40 and line WBB40 are electrically coupled together.

In some embodiments, metal pieces M1_TieLow_N43, M1_TieLow_N44, M1_WBB40 are on a same layer, such as the metal one layer.

In some embodiments, metal pieces M1_TieLow_N43 and M1_TieLow_N44 are electrically coupled together, but are not shown in FIG. 5B. For example, another metal piece (not shown) on the metal one layer couples metal pieces M1_TieLow_N43 and M1_TieLow_N44.

Dummy Tracking Cell, Some Embodiments

Figure 6:
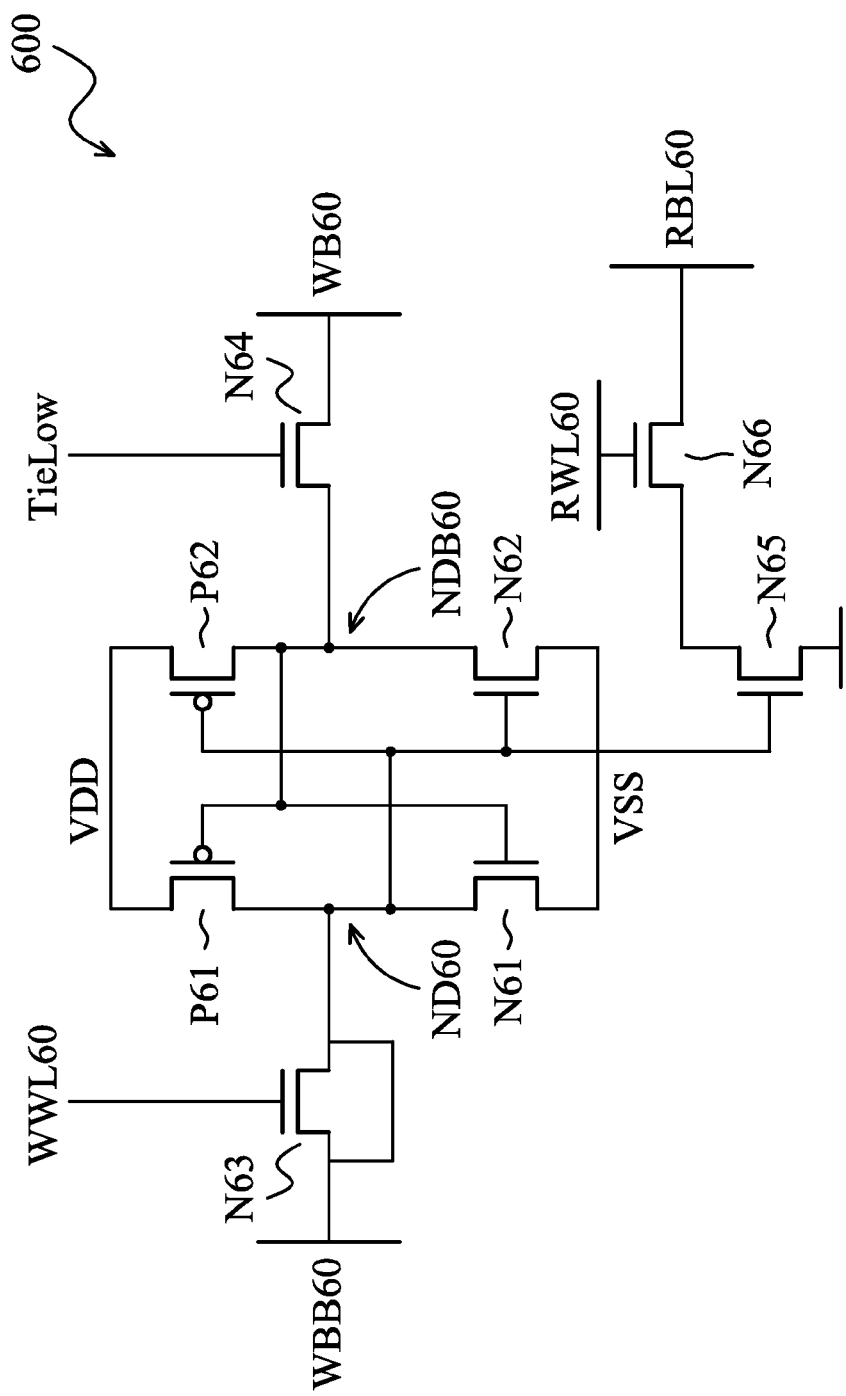
FIG. 6 is a diagram of a circuit of a tracking cell, in accordance with some embodiments.

FIG. 6 is a diagram of a circuit 600, in accordance with some embodiments. In some embodiments, circuit 600 is another dummy tracking cell used to affect a load of a write tracking circuit and/or a read tracking circuit. For example, in FIG. 4 of the Write Tracking Application, tracking write bit line driver WBLDRVTK is coupled with another tracking write bit line WBLTK that in turns is coupled with a plurality of dummy tracking cells 600. Alternatively and/or additionally, in FIG. 6 of the Read Tracking Application, each of tracking bit lines $TBL_R$' and $TBL_L$' is coupled with a plurality of dummy tracking cells 600.

Dummy tracking cell 600 includes transistors similar to transistors in dummy tracking cell 400 in FIG. 4, except that transistors in dummy tracking cell 600 are configured differently from transistors in tracking cell 400.

For example, compared with tracking cell 400, transistors P61, P62, N61, N62, N63, N64, N65, and N66 correspond to transistors P41, P42, N41, N42, N43, N44, N45, and N46, respectively. Lines WBB60, WB60, RWL60, and RBL60 correspond to lines WBB40, WB40, RWL40, and RBL40, respectively. Nodes ND60 and NDB60 correspond to nodes ND40 and NDB40, respectively. A gate of transistor N63 is not coupled with a gate of transistor N64, and therefore is not configured to receive the TieLow signal, however. The gate of transistor N63 is coupled with a line WWL60, which corresponds to write word line WWLW of memory cell MEM-CELL in FIG. 1A.

Figure 7A:
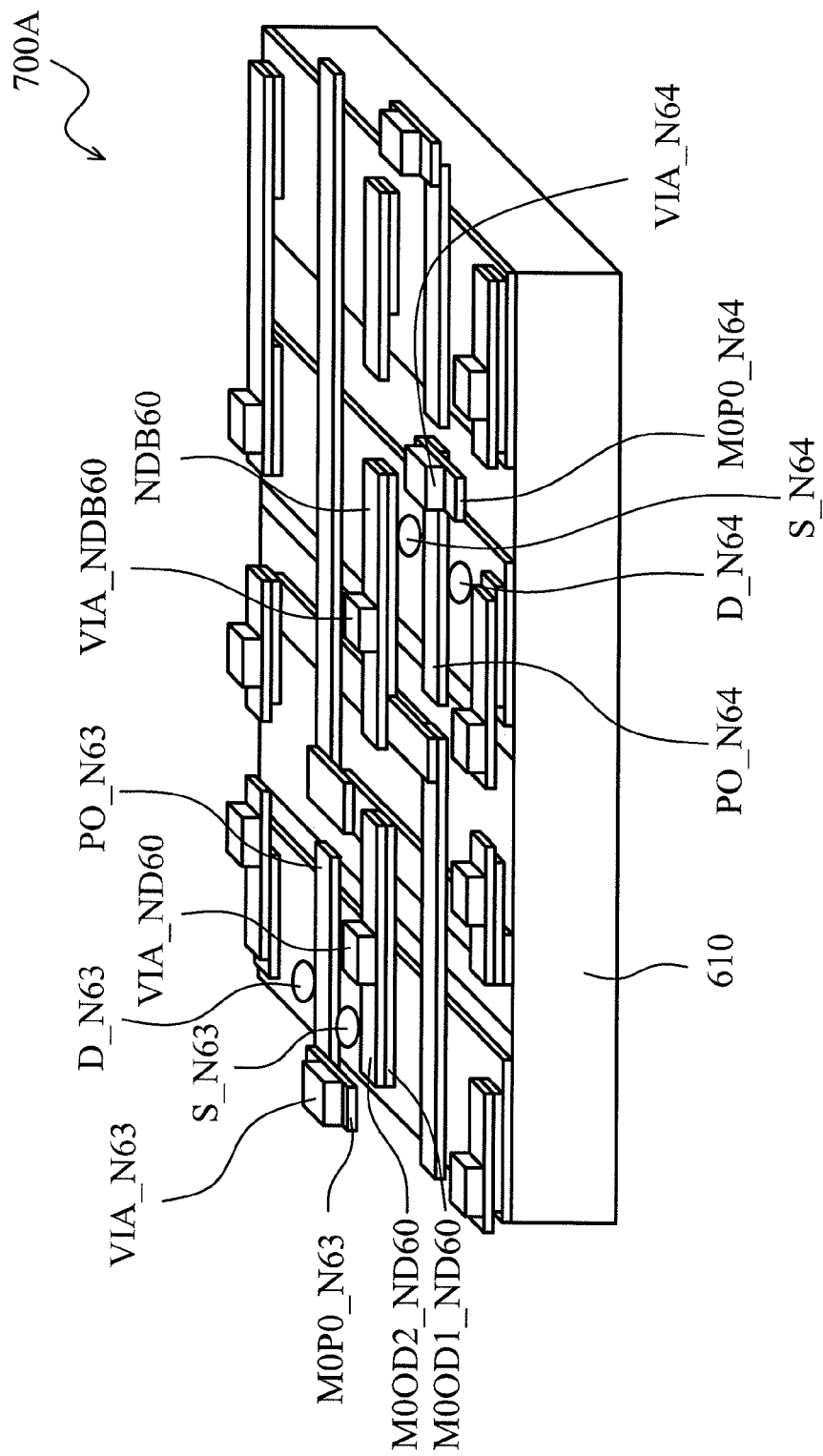
FIGS. 7A and 7B are diagrams of layout arrangements of circuit elements of the circuit in FIG. 6, in accordance with some embodiments.
Figure 7B:
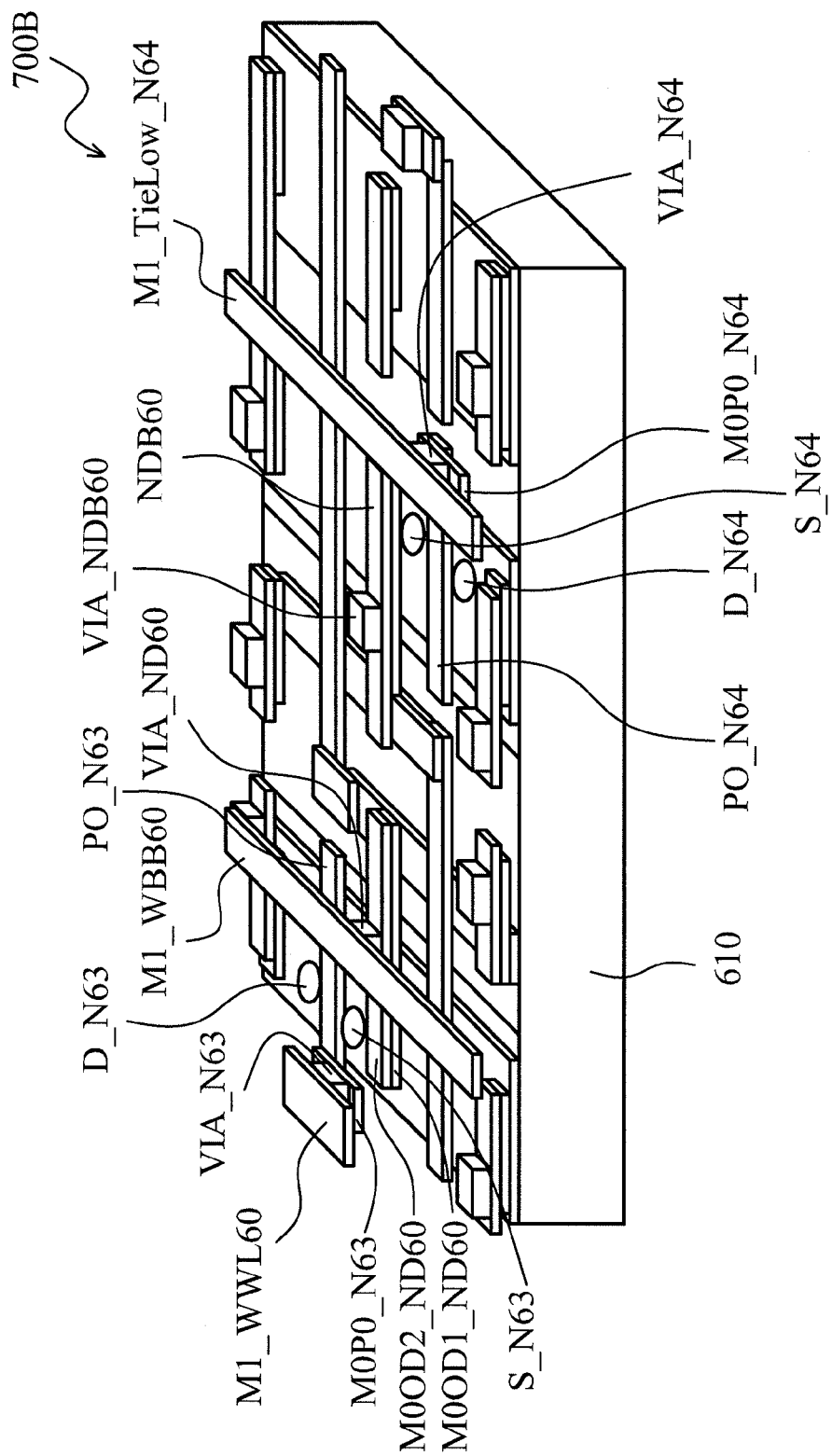

FIGS. 7A and 7B are diagrams of layout arrangements 700A and 700B of circuit 600, in accordance with some embodiments. Layout 700B includes layout 700A with an addition of metal pieces M1_WWL60, M1_TieLow_N64, and M1_WBB60. For simplicity, some circuit elements in FIGS. 7A and 7B are labeled while some other circuit elements are not labeled.

Similar to layouts 300A and 500A, layout 700A includes a substrate 610, OD areas, a plurality of layers of different types, such as a poly layer, a poly-to-OD layer, metal layers, etc., which were described above with reference to FIG. 3A.

In FIG. 7A, a piece of poly PO_N64 is used to form a gate of transistor N64 in FIG. 6. An OD area D_N64 is used to form a drain of transistor N64. An OD area S_N64 is used to form a source of transistor N64. OD areas D_N64 and S_N64 are part of substrate 610.

A piece of contact M0P0_N64 is coupled with poly piece PO_N64 is formed as the gate of transistor N64. In some embodiments, piece M0P0_N64 includes materials used as contacts, vias, or the like. A via VIA_N64 is coupled with piece M0P0_N64. As shown in FIG. 7B, via VIA_N64 is coupled with a piece of metal M1_TieLow_N64.

A piece of poly PO_N63 is used to form a gate of transistor N63 in FIG. 6. An OD area D_N63 is used to form a drain of transistor N63. An OD area S_N63 is used to form a source of transistor N63. OD areas D_N63 and S_N63 are part of substrate 610.

A piece of contact M0P0_N63 is coupled with poly piece PO_N63. In some embodiments, piece M0P0_N63 includes materials used as contacts, vias, or the like. A via VIA_N63 is coupled with piece M0P0_N63. As shown in FIG. 7B, via VIA_N63 is coupled with a piece of metal M1_WWL60. Effectively, poly piece PO_N63 is electrically coupled with metal piece M1_WWL60.

A piece of contact M0OD1_ND60 is electrically coupled with diffusion area S_N63. In some embodiments, piece M0OD1_ND60 includes materials used as contacts. A piece of M0OD2_ND60 functions as node ND60 in FIG. 6. Piece M0OD2_ND60 is coupled with piece M0OD1_ND60. A via VIA_ND60 is coupled with piece M0OD2_ND60. As shown in FIG. 7B, a piece of metal M1_WBB60 is coupled with via VIA_ND60. Metal piece M1_WBB60 is coupled with line WBB60. Effectively, node ND60 and line WBB60 are electrically coupled together.

In some embodiments, metal pieces M1_WWL60, M1_TieLow_N64, M1_WBB60 are on a same layer, such as the metal one layer.

In some embodiments, a circuit comprises a first transistor of a first type, a second transistor of the first type, a first transistor of a second type, a second transistor of the second type, a third transistor of the second type, and a fourth transistor of the second type. The first transistor of the first type, the second transistor of the first type, the first transistor of the second type, and the second transistor of the second type form a cross latch having a first node and a second node. A first terminal of the third transistor of the second type is coupled with the first node. A first terminal of the fourth transistor of the second type is coupled with the second node. At least one of a second terminal of the third transistor of the second type and a second terminal of the fourth transistor of the second type is configured to receive a signal that is not directly from a power source and is sufficient to turn off the third transistor and the fourth transistor.

In some embodiments, a circuit comprises a first transistor and a second transistor. The first transistor includes a first piece of poly configured as a gate of the first transistor, a first piece of contact coupled with the first piece of poly, a first via coupled with the first piece of contact, and a first piece of metal coupled with the first via and configured to carry a signal that is not directly from a power source and is sufficient to turn off the first transistor or the second transistor. The second transistor includes a second piece of poly configured as a gate of the second transistor, a second piece of contact coupled with the second piece of poly, a second via coupled with the second piece of contact, and a second piece of metal coupled with the second via. The first piece of metal and the second piece of metal are of a same layer.

In some embodiments, a circuit comprises a cross latch having a first node and a second node, a first transistor, and a second transistor. The first transistor includes a first piece of contact, a first piece of interconnect coupled with the first piece of contact and configured as the first node of the cross latch, a first via coupled with the first piece of interconnect, and a first piece of metal coupled with the first via. The second transistor is coupled with the second node of the cross latch.

A number of embodiments have been described. It will nevertheless be understood that various modifications may be made without departing from the spirit and scope of the disclosure. For example, various transistors being shown as a particular dopant type, such as N-type or P-type Metal Oxide Semiconductor (NMOS or PMOS) are for illustration purposes. Embodiments of the disclosure are not limited to a particular type. Selecting different dopant types for a particular transistor is within the scope of various embodiments. A low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. In various embodiments, a source of a transistor can be configured as a drain, and a drain can be configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
   a first transistor of a first type;
   a second transistor of the first type;
   a first transistor of a second type;
   a second transistor of the second type;
   a third transistor of the second type; and
   a fourth transistor of the second type;
   wherein
   the first transistor of the first type, the second transistor of the first type, the first transistor of the second type, and the second transistor of the second type form a cross latch having a first node and a second node;
   a first terminal of the third transistor of the second type is coupled with the first node;
   a first terminal of the fourth transistor of the second type is coupled with the second node; and
   at least one of a second terminal of the third transistor of the second type or a second terminal of the fourth transistor of the second type is configured to receive a signal that is not directly from a power source and is sufficient to turn off the third transistor or the fourth transistor.

2. The circuit of claim 1, wherein
a third terminal of the fourth transistor of the second type is electrically coupled with the first terminal of the fourth transistor of the second type.

3. The circuit of claim 2, wherein
the first terminal of the fourth transistor of the second type includes a diffusion area, and is electrically coupled with a first piece of a contact, a piece of an interconnect, a via, and a conductive piece.

4. The circuit of claim 3, further comprising another conductive piece configured to carry the signal, wherein the conductive piece and the another conductive piece are of a same layer.

5. The circuit of claim 1, wherein
the second terminal of the third transistor of the second type includes a piece of poly, and is electrically coupled with a first piece of a contact, a via, and a conductive piece.

6. The circuit of claim 5, wherein
the conductive piece is configured to carry the signal.

7. The circuit of claim 1, further comprising a read port coupled with either the first node or the second node.

8. The circuit of claim 1, wherein
both the second terminal of the third transistor of the second type and the second terminal of the fourth transistor of the second type are configured to receive the signal;
the circuit further comprising a read port coupled with the first node; and
a third terminal of the fourth transistor of the second type is electrically coupled with the first terminal of the fourth transistor of the second type.

9. The circuit of claim 1, wherein
the second terminal of the fourth transistor of the second type is configured to receive the signal, and the second terminal of the third transistor of the second type is configured to not receive the signal;
the circuit further comprising a read port coupled with the first node; and
a third terminal of the third transistor of the second type is electrically coupled with the first terminal of the third transistor of the second type.

10. A circuit comprising:
a first transistor coupled with a first node of a cross latch, the first transistor includes
a first piece of poly configured as a gate of the first transistor;
a first contact coupled with the first piece of poly;
a first via electrically coupled with the first contact; and
a first conductive piece coupled with the first via and configured to carry a signal that is not directly received from a power source, the signal being sufficient to turn off the first transistor; and
a second transistor coupled with a second node of the cross latch, the second transistor includes
a second piece of poly configured as a gate of the second transistor;
a second contact coupled with the first piece of poly;
a second via coupled with the second contact; and
a second conductive piece coupled with the second via, wherein
the first conductive piece and the second conductive piece are of a same layer.

11. The circuit of claim 10, wherein
the second conductive piece is configured to carry the signal.

12. The circuit of claim 10, wherein
the first transistor further comprises
a third contact;
a piece of an interconnect configured as the first node of the cross latch and coupled with the third contact;
a third via coupled with the piece of the interconnect; and
a third conductive piece coupled with the third via, wherein
the first conductive piece and the third conductive piece are of a same layer.

13. The circuit of claim 12 further comprising a read port coupled with the first node of the cross latch.

14. The circuit of claim 12 further comprising a read port coupled with a second node of the cross latch.

15. A circuit comprising:
a cross latch having a first node and a second node;
a first transistor that includes
a first contact;
a first piece of an interconnect coupled with the first contact and configured as the first node of the cross latch;
a first via coupled with the first piece of the interconnect;
a first conductive piece coupled with the first via; and
a second transistor coupled with the second node of the cross latch,
wherein
at least one of a gate of the first transistor or a gate of the second transistor is configured to receive a signal that is not directly from a power source and is sufficient to turn off the first transistor or the second transistor.

16. The circuit of claim 15, wherein
the first transistor includes
a first piece of poly configured as a gate of the first transistor;
a second contact coupled with the first piece of poly;
a first via coupled with the second contact; and
the first conductive piece coupled with the first via and configured to carry the signal that is not directly from the power source and is sufficient to turn off the first transistor or the second transistor;
the second transistor includes
a second piece of poly configured as a gate of the second transistor;
a third contact coupled with the first piece of poly;
a second via coupled with the third contact; and
a second conductive piece coupled with the second via, wherein
the first conductive piece and the second conductive piece are of a same layer.

17. The circuit of claim 15, further comprising a read port coupled with the first node.

18. The circuit of claim 15, further comprising a read port coupled with the second node.

* * * * *